United States Patent [19]

Gässler

[11] Patent Number: 4,849,872

[45] Date of Patent: Jul. 18, 1989

[54] PROCESS AND APPARATUS FOR PHASE-REGULATED POWER AND FREQUENCY CONTROL OF AN ULTRASONIC TRANSDUCER

[76] Inventor: Herbert Gässler, Rotweg 4, D-7909 Bollingen, Fed. Rep. of Germany

[21] Appl. No.: 147,743

[22] Filed: Jan. 25, 1988

[51] Int. Cl.⁴ ........................ H01L 41/08; H03B 5/32

[52] U.S. Cl. ........................ 363/49; 310/316; 239/102.2; 323/901

[58] Field of Search ........................ 363/22-25, 363/49, 133; 310/316-319; 239/4, 101, 102.1, 102.2; 323/901

[56] References Cited

U.S. PATENT DOCUMENTS

| | | | |
|---|---|---|---|
| 3,889,166 | 6/1975 | Scurlock | 310/316 X |
| 3,975,650 | 8/1976 | Payne | 310/316 |
| 4,271,371 | 6/1981 | Furuichi et al. | 310/316 |
| 4,275,363 | 6/1981 | Mishiro et al. | 310/316 X |
| 4,302,728 | 11/1981 | Nakamura | 310/316 X |
| 4,445,063 | 4/1984 | Smith | 310/316 |
| 4,551,690 | 11/1985 | Quist | 310/316 X |
| 4,562,413 | 12/1985 | Mishiro et al. | 310/316 X |
| 4,626,728 | 12/1986 | Flachenecker et al. | 310/316 |
| 4,632,311 | 12/1986 | Nakane et al. | 310/316 X |
| 4,703,213 | 10/1987 | Gäsler | 310/316 |

*Primary Examiner*—Patrick R. Salce
*Assistant Examiner*—Emanuel Todd Voeltz
*Attorney, Agent, or Firm*—Herbert Dubno

[57] ABSTRACT

A phase-regulated power and frequency control of an ultrasonic transducer which is supplied by a variable frequency oscillator of a phase control circuit with a plurality of voltage pulses amplified by a driver. First the variable frequency oscillator is canned to find a resonance frequency of the ultrasonic transducer and the scanner is locked to the resonance frequency of the ultrasonic transducer after locking into the phase control circuit. After initial oscillation of the ultrasonic transducer in the vicinity of a series resonance frequency thereof a capacitive phase angle between voltage and current is introduced and is maintained operationally so that by phase control of the phase control circuit the operating frequency of the oscillator is reduced relative to the series resonance frequency of the transducer. A phase angle change as a result of mechanical loading of the transducer leads to an increase of the operating frequency of the oscillator and thus to a shift toward the series resonance frequency of the transducer.

20 Claims, 3 Drawing Sheets

PROCESS AND APPARATUS FOR PHASE-REGULATED POWER AND FREQUENCY CONTROL OF AN ULTRASONIC TRANSDUCER

FIELD OF THE INVENTION

My present invention relates to a process and an apparatus for phase-regulated power and frequency control of an ultrasonic transducer.

BACKGROUND OF THE INVENTION

Phase-regulated power and frequency control of an ultrasonic transducer can use a variable frequency oscillator of a phase control circuit with voltage pulses amplified by a driver. In that process first the frequency of the oscillator is varied by a wobbler to find the resonance of the ultrasonic transducer and the scanner is locked to the resonance frequency of the ultrasonic transducer after locking in the phase control circuit.

German Pat. No. 34 01 735 describes an apparatus which has been proven to be effective in practice and particularly eliminates the numerous outstanding problems and difficulties which had earlier existed in operating ultrasonic transducers.

As is known in applications of ultrasonic transducers for liquid atomizers or for welding purposes the oscillator supplying the excitation frequency for the transducer must be able to adjust to numerous different operating properties of the piezoelectric or magnetostrictive transducers.

Changes of the resonance frequency of the transducer can occur which depend on the load on the transducer, on the temperature and on the aging of the piezoceramic and/or the magnetostrictive material.

Further impedance changes of the transducer can be produced by the specific properties of the transducer material, especially the physical properties of the piezodisks.

Finally changes of phase angle between the voltage and current in the transducer may occur which are likewise dependent on the excitation frequency, the load, the amplitude and the temperature. These phenomena occur in practical applications so that the oscillator must be adjusted for the given changes of operating conditions.

In the apparatus described in German Patent 34 01 735 this succeeds because of the use of a phase control circuit. The transient start-up oscillations of the transducer under heavy damping cause difficulties however, when for example residual fluid droplets are found on the transducer or start-up liquid not sprayed flows along the transducer before oscillation.

Then frequently the excitation energy available is not sufficient to permit the start-up of oscillation. A general increase of the start-up oscillation power has in contrast the disadvantage of uneconomical operation and could mask the danger of an overload of the transducer.

Besides the oscillation amplitude influenced by the transducer power also determines the droplet size, which in itself is usually determined by the application, so that on this basis the limits of the free variation of the excitation power are set.

Finally an ultrasonic transducer should be operated with constant oscillation amplitude to maintain a uniform droplet spectrum in liquid atomization.

OBJECTS OF THE INVENTION

It is an object of my invention to provide an improved process and apparatus for phase-regulated power and frequency control of an ultrasonic transducer which will avoid the drawbacks mentioned above.

It is an object of my invention to provide an improved process and apparatus for phase-regulated power and frequency control of an ultrasonic transducer in which a start-up of oscillation of the ultrasonic transducer under heavy damping is guaranteed and also a breakdown of oscillation during large damping changes is reliably avoided.

SUMMARY OF THE INVENTION

These objects and others which will become more readily apparent hereinafter are attained in accordance with my invention in a process for phase-regulated power and frequency control of a ultrasonic transducer which is energized by a variable-frequency oscillator of phase control circuit with voltage pulses amplified by a driver in which the variable-frequency oscillator is first varied by a wobbler to find the resonance of the ultrasonic transducer and a scanner is locked to the resonance frequency of the ultrasonic transducer after locking in the phase control circuit.

According to my invention, after initial oscillation of the ultrasonic transducer in the vicinity of a series resonance frequency thereof a capacitive phase angle between voltage and current is introduced and is maintained operationally (i.e. by feedback control) in the transducer and by phase control of the phase control circuit the operating frequency of the oscillator during operation is reduced relative to the series resonance frequency of the transducer, while a phase angle change as a result of mechanical loading of the transducer leads to an increase of the operating frequency of the oscillator and thus to a shift toward the series resonance frequency of the transducer.

With my invention the ultrasonic transducer, in contrast to the approach used heretofore, is not operated at resonance, but instead just below its resonance frequency in a quasiforced oscillation.

This means of course, on account of the clearly higher transducer impedance off resonance, that a higher transducer voltage than is required in resonance is necessary. On account of the large impedance change in the vicinity of the resonance frequency, the start-up power in the transducer is substantially increased by the small frequency change. Since further in the vicinity of the resonance frequency of the transducer the phase gradient of the phase angle change between current and voltage in the transducer depending on the frequency is very large, phase angle changes caused by damping of the transducer result in operating frequency changes in the direction of the resonance frequency which then cause an increase in the transducer power. In this way the process of my invention stands out as especially suitable to supply the power required for optimization of the atomization to the transducer for all operating cases automatically. Hence a breakdown of the oscillation with too large liquid throughput is prevented. The transducer power adjusts also to different liquid densities and viscosities of different liquids to be atomized.

The capacitive phase angle between current and voltage advantageously can be from −30° to −85°.

Also within the scope of my invention the phase gradient in the frequency range lying below the series resonance frequency can be adjusted by an additional impedance in the transducer circuit so that the transducer power increased by the lowering transducer impedance on shifting of the operating frequency to the series resonance frequency substantially balances the damping of the transducer. Hence, the required power is fed approximately to the transducer directly in each operating state.

The desired high efficiency can be effected by the excitation of the transducer with pulses, but then the transducer could over oscillate at its different characteristic frequency. Thus the invention provides two voltage pulses of opposite polarity which are displaced about a half wave cycle be fed to the transducer per oscillation. Hence the phase control loop release or disengagement is prevented, especially with larger variations between the characteristic frequency of the transducer and the excitation frequency.

So as not to strongly disturb on the other hand the characteristic frequency of the transducer, the duration of the voltage pulse can be smaller than a fourth of the period of the transducer oscillation. To avoid an unbalanced oscillatory shape the duration of both voltage pulses per period are compared with each other by integration and the duration of at least one of both voltage pulses is adjusted for uniformity of both voltage pulses.

To attain a rapid and reliable locking of the frequency by the phase control circuit or loop it is particularly advantageous when the wobbler provided to seek the resonance frequency (by a forced ranging of the oscillator output frequency) starts in a frequency below the resonance frequency of the transducer. To attain the reliable locking in of the phase control circuit the wobbler process can advantageously extend over $5\times10^3$ periods of the resonance frequency. Also the wobbler frequency range can be restricted to a frequency band having no side resonances so that it is guaranteed that the phase control circuit can be locked only in at the series resonance frequency of the transducer.

My invention also includes an apparatus for operation of a piezoelectric ultrasonic transducer, having an oscillator controlled by a phase control circuit for generation, a driver stage for amplification and a transformer for transmission of an excitation pulse for the transducer. The synchronization signal required for influencing the phase control circuit is detected in a coil of the transformer. The apparatus also has a wobbler which varies under control or scans the oscillator frequency to find the resonance frequency of the transducer and after locking in the phase control circuit is locked to the resonance frequency.

According to the invention in which an adjustable phase shift member is connected to the phase detector of the phase control circuit. Its phase shift angle is so set that on locking in the phase control loop a capacitive phase angle between current and voltage in the transducer is maintained.

To attain an adjustable high power on increased loading of the transducer an additional impedance can be provided to reduce the frequency dependent phase amplitude below the series resonance frequency of the transducer. This additional impedance can be formed by a condenser connected in parallel to the transducer in an advantageous example of my invention.

An especially suitable form of my invention results when the capacitance of the condenser forming the additional impedance and the customary capacitance not associated with the transducer amounts to about a third of the low frequency ground capacitance of the transducer.

The inductance of a secondary coil of the transformer is determined according to the Thompson formula considering all capacitances of the transducer circuit and is measured at a frequency higher by a factor of 1.3 than the frequency of the series resonance frequency of the transducer.

To attain a uniform control despite the forced oscillation and to prevent a disengagement of the phase control circuit, the driver can be a push-pull driver so that during each period two voltage pulses of opposite polarity are fed to the transducer. Thus the driver stage can have a balancing stage or circuit which integrates both voltage pulses of the push-pull driver and compares them with one another by a comparator which adjusts the operating point of one of the push-pull drivers when there is a asymmetry or a condition of imbalance.

To attain an additional satisfactory adjustment of the excitation power, the operating voltage of the driver stage can be variably adjusted by the wobbler and/or the lock in signal of the phase control loop. Finally an especially good efficiency can be attained when the control of the operating voltage occurs by an oscillating current supply, whose cycle frequency corresponds to the oscillator frequency of the phase control loop. Hence disturbances in the phase control circuit called for by cyclic current supply can otherwise be avoided.

BRIEF DESCRIPTION OF THE DRAWING

The above and other objects, features and advantages of my invention will become more detectedily apparent from the following description, reference being made to the accompanying highly drawing in which.

SPECIFIC DESCRIPTION

Figure 1:
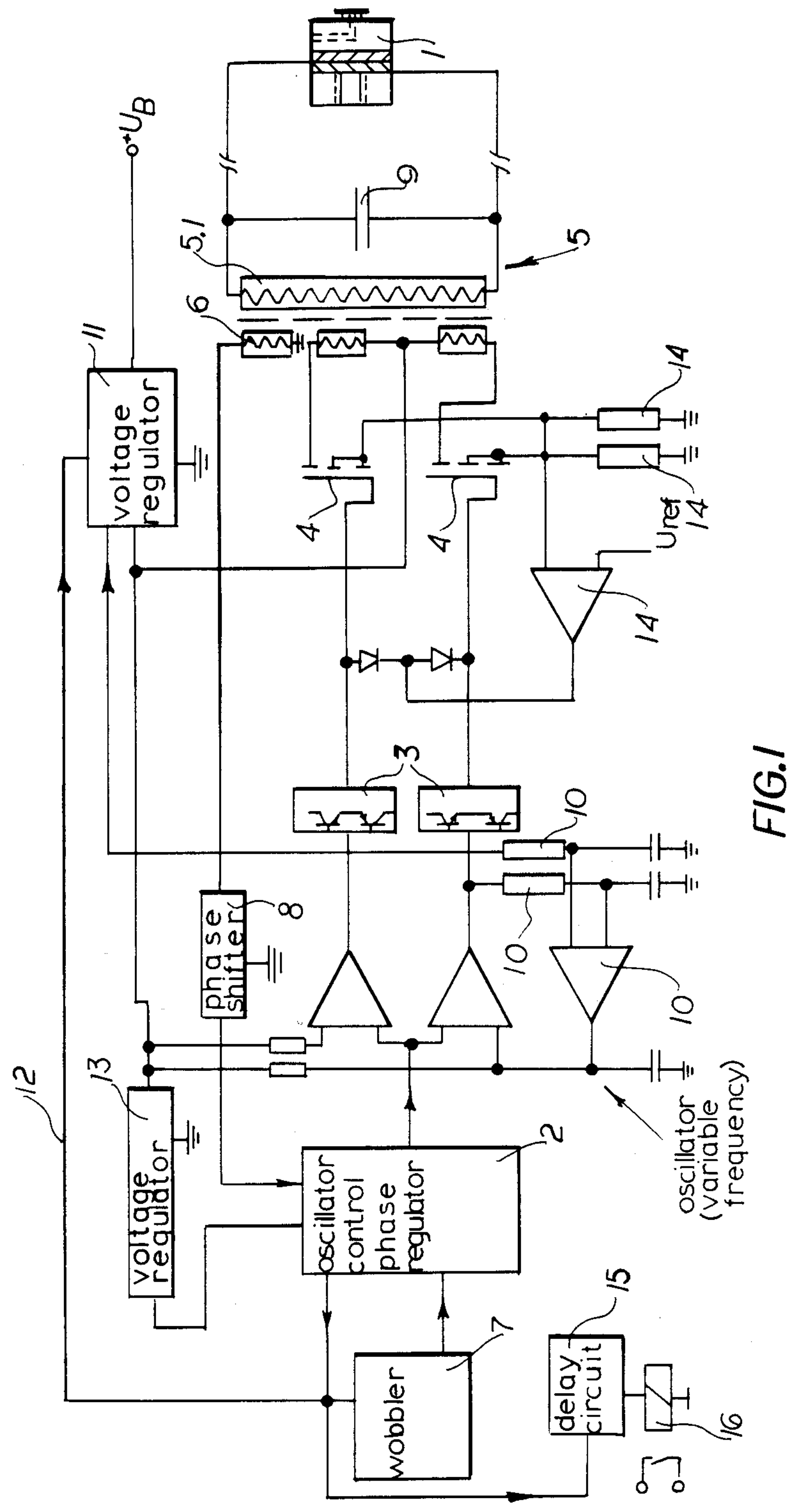
FIG. 1 is a block diagram of a circuit comprising an apparatus my invention.

The circuit shown in FIG. 1 of the drawing acts to drive a piezoelectric ultrasonic transducer 1. To establish the excitation frequency an oscillator 10 not shown in detail in the drawing controlled by an ordinary phase control circuit 2 is provided whose output frequency is amplified by a driver 3, 4.

The driver 3, 4 feeds the transducer 1 through a transformer 5.

The synchronizing signal needed to influence the phase control circuit 2 is detected in a coil 6 of the transformer 5.

Figure 2:
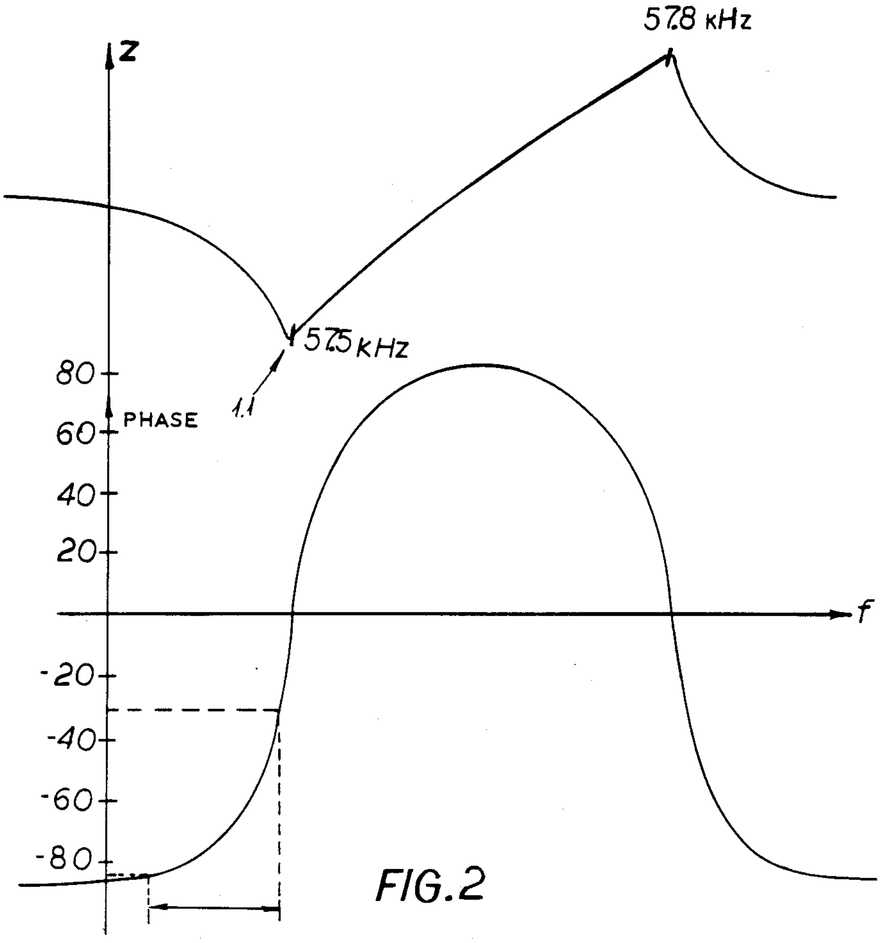
FIG. 2 is a graphical representation of the frequency response and the phase relationship of an ultrasonic transducer in the resonance region; and FIGS. *3a* and *3b* are vector diagrams for an ultrasonic transducer with reduced and increased load for the equivalent secondary circuit illustrated in FIG. *3c*.

Further a wobbler 7 is provided which first scans or sweeps the oscillator frequency to find the series resonance frequency of the transducer 1 indicated with 1.1 in FIG. 2 and after locking in the phase control circuit 2 is locked on the resonance frequency.

An adjustable phase shifting member 8 is connected to the phase detector of the phase control circuit 2 which provides a phase shift of the synchronization signal. Its phase angle is so adjusted that on locking in the phase control circuit 2 a capacitive phase angle between current and voltage exists in the transducer 1.

To be able to maintain these phase conditions the phase control circuit 2 must, as results from the phase and impedance relationships in FIG. 2, reduce the excitation frequency so that the transducer 1 is driven in a quasiforced oscillation below its resonance frequency.

As may be seen further from FIG. 2 reduced variations of the phase lead to similarly reduced frequency changes which then causes a comparatively large variation in the transducer impedance.

Figure 3A:
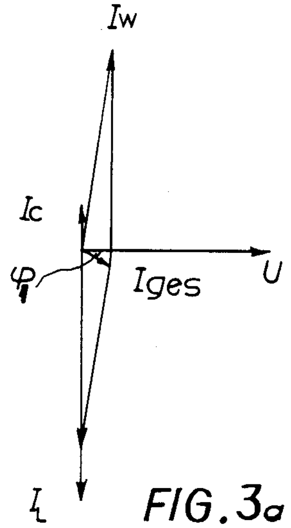

If by a strong damping of the transducer 1, as is shown in FIG. 3*a*, the phase angle in the transducer experiences a slight shift, it causes a frequency increase which results in an increase of the input power into it.

Figure 3B:
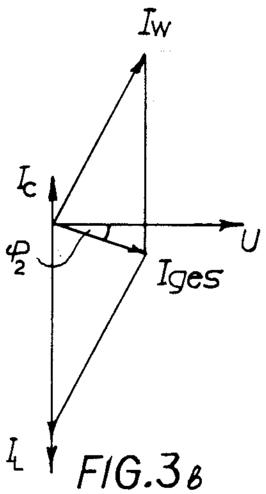
Figure 3C:
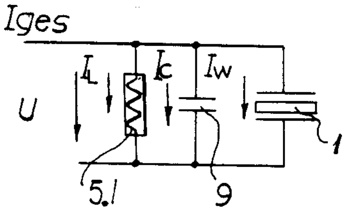

Further in FIG. 3 the current through the secondary coil 5.1 of the transformer 5 is indicated with $I_L$. The current which as a result flows through an auxiliary impedance 9 to be described is indicated with $I_C$. The transducer current is indicated with $I_W$ and the voltage at the transducer with 11. The phase angle Ò gives the phase relation between the total current $I_{ges}$ and the voltage U. Thus the phase angle change set on loading the transducer $d\phi=\phi_1-\phi_2$ is evaluated by the phase control circuit.

To correctly reset the power on increasing the transducer load it is required that the phase gradient be adjusted in the region below the series resonance frequency of the transducer 1.

An additional impedance 9 in the form of a condenser connected in parallel to the transducer 1 is provided which attenuates the phase change.

Both the capacitance of the condenser forming the additional impedance 9 and the customary capacitance not conditioned by the transducer 1 like the cable capacitance are regulated so that they amount to about a third of the low frequency ground capacitance of the transducer 1. The inductance of the secondary coil 5.1 of the transformer 5 is determined then according to the Thompson formula considering all capacitance in the transducer circuit and based on a frequency higher by a factor of 1.3 than the transducer series resonance frequency.

The driver 3, 4 particularly can be a push-pull driver in which the transducer 1 receives an excitation pulse during each half wave cycle. Hence, it is guaranteed that the transducer customarily driven in a forced oscillation but freely oscillating after the exciting pulse can operate not so far from the excitation frequency that a disengagement with the phase control circuit 2 should be feared.

To keep the waveform from the transducer 1 as distortion-free as possible, which has value in regard to the uniform droplet spectrum, the driver 3,4 is connected to a balancing circuit 10 which integrates both voltage pulses of the push-pull driver and compares them with each other by a comparator.

With a distortion or imbalance of both voltage pulses the operating point of one of both push-pull drivers is appropriately reset by the balancing circuit 10.

To provide an additional power regulation the operating voltage of the voltage controller 11 for the driver 3,4 is variably adjusted by the wobbler 7 and/or if necessary by the lock in signal of the phase control circuit 2 as is indicated in drawing by the conductor 12. To start oscillation the voltage controller 11 first can make available its maximum output voltage which is reduced to the provided operating value after the occuring preoscillation.

However also without this additional voltage regulation the starting oscillation or preoscillation of the transducer 1 continues with maximum power since the phase control circuit then locks into the series resonance frequency of the transducer 1 and it has its minimum impedance and thus receives the maximum possible power.

First after preoscillation a lowering of the frequency occurs, then by control of the phase and and as a result the increase in impedance conditioned by it, a reduction in the excitation power occurs.

The regulation of the operating voltage can occur besides by an oscillating current supply. Its cycle frequency advantageously corresponds to the oscillator frequency of the phase control circuit so disturbing the control circuit can be avoided. For the phase control circuit itself a suitable voltage controller 13 is provided.

To avoid overloading the driver 3, 4 and/or the transducer 1 an overload safety device 14 is provided with whose help the primary current passing through the transformer 5 and if necessary the level control is limited.

For an additional improvement of the start-up or transient oscillation conditions the liquid input to the transducer 1 is delayed by a liquid valve 16 operated by a timing circuit 15.

I claim:

1. A method of phase-controlled power and frequency regulation of an ultrasonic transducer for dispersion of a liquid under conditions wherein said transducer is loaded variably by said liquid, said method comprising the steps of:

(a) driving said ultrasonic transducer with voltage pulses amplified by a driver stage from a variable-frequency oscillator of a phase-control circuit;

(b) initially varying a frequency of said oscillator by a wobbler to establish a series resonant frequency of said transducer and locking an output frequency of said oscillator at said series resonant frequency with said phase-control circuit;

(c) thereafter setting and maintaining a capacitive phase angle between current and voltage in said transducer so that said phase-control circuit reduces the output frequency of said oscillator so that it is reduced relative to said series resonant frequency; and (d) automatically shifting said phase-angle output in a direction resulting in an increase in said output frequency, thereby shifting said output frequency more closely toward said series resonant frequency of the transducer in response to mechanical loading of said ultrasonic transducer by said liquid.

2. The method defined in claim 1 wherein said capacitive phase angle between said current and said voltage in said transducer is from −30° to −85°.

3. The method defined in claim 1 wherein a phase gradient at low frequencies below said series resonance frequency is set by an additional impedance in a transducer circuit connected with said transducer so that transducer power is increased by a lowered transducer impedance on shifting said operating frequency to said series resonant frequency substantially compensating for a damping of said transducer.

4. The method defined in claim 1 wherein said transducer is supplied with two voltage pulses of opposing polarity which are displaced by a half wave cycle relative to each other for each oscillatory cycle.

5. The method defined in claim 4 wherein the duration of said voltage pulses is less than a fourth of a period of oscillation of said transducer.

6. The method defined in claim 5 wherein said duration of each of said voltage pulses for each said period are compared with each other by integration and said duration of at least one of said voltage pulses is controlled for uniformity of both of said voltage pulses.

7. The method defined in claim 1 wherein said wobbler is controlled to generate a frequency range which starts at a wobbler frequency which is below said resonance frequency.

8. The method defined in claim 7 wherein step (b) is carried out for about $5\times10^3$ periods of oscillation at said resonance frequency.

9. The method defined in claim 7 wherein said range of said wobbler is limited to a frequency range having no additional side resonances of said transducer.

10. In an apparatus for phase-regulated power and frequency control of an ultrasonic transducer in contact with a liquid to be dispersed thereby and variably loaded in said liquid, particularly a piezoelectric ultrasonic transducer, comprising a variable-frequency oscillator controlled by a phase control circuit for generation of voltage pulses, a driver connected to receive said voltage pulses for amplification and a transformer for transmission of excitation pulses for said transducer, a synchronization signal required for influencing said phase control circuit being detected in a coil of said transformer, and a wobbler which varied an output frequency of said oscillator to find a series resonance frequency of said transducer and said phase control circuit locks said output frequency to said resonance frequency, the improvement wherein an adjustable phase shift member is connected to said phase control circuit whose phase shift angle is adjusted so that with said phase control circuit locking to said series resonant frequency but lies below said series resonant frequency a capacitive phase angle between current and voltage is maintained in said transducer so that said phase angle is automatically shifted in a direction resulting in an increase in said output frequency, thereby shifting said output frequency more closely toward said series resonant frequency of said transducer.

11. The improvement according to claim 10 wherein an additional impedance is connected to said transducer in a transducer circuit which reduces the output frequency below said series resonant frequency of said transducer.

12. The improvement according to claim 11 wherein said additional impedance is formed by a condenser connected in parallel to said transducer.

13. The improvement according to claim 12 wherein the capacitance of said condenser forming said additional impedance and capacitance of the transducer circuit not derived from said transducer each amount to about a third of a low frequency basic capacitance of said transducer.

14. The improvement according to claim 13 wherein the inductance of a secondary coil of said transformer is determined according to the Thompson formula considering all of the capacitance of said transducer circuit and is measured at a frequency of about 1.3 times said series resonant frequency of said transducer.

15. The improvement according to claim 14 wherein said driver is a push-pull driver.

16. The improvement according to claim 15 wherein said driver is connected to a balancing circuit which integrates both of a pair of voltage pulses of said push-pull driver and compares said voltage pulses in a comparator and which adjusts the operating point of a portion of said push-pull driver when an unbalanced condition is detected.

17. The improvement according to claim 10 wherein the operating voltage of said driver is variably adjusted by said wobbler and/or the locked in signal of said phase control circuit.

18. The improvement according to claim 17 wherein the control of said operating voltage of said driver occurs by a cyclic voltage source whose cycle frequency corresponds to the oscillator frequency of said phase control circuit.

19. A process for phase-regulated power and frequency control of an ultrasonic transducer which is energized by a variable frequency oscillator of a phase control circuit with a plurality of voltage pulses amplified by a driver comprising:

(a) scanning said variable-frequency oscillator to find a resonance frequency of said ultrasonic transducer with a wobbler;
(b) locking in said phase control circuit;
(c) locking said wobbler to said resonance frequency of said ultrasonic transducer;
(d) after start-up of oscillation of said ultrasonic transducer near a series resonance frequency of said resonance frequencies introducing and maintaining operationally a capacitive phase angle of from $-30°$ to $-85°$ between voltage and current in said transducer;
(e) controlling the phase of said phase control circuit to reduce an operating frequency of said oscillator relative to said series resonance frequency of said transducer so that a phase angle change as a result of mechanical loading of said transducer leads to an increase of said operating frequency of said oscillator and thus to a shift toward said series resonance frequency of said transducer; and
(f) adjusting an additional impedance in a circuit associated with said transducer to set a phase gradient at low frequencies below said series resonance frequency.

20. The process according to claim 19 wherein said transducer is fed two of said voltage pulses of opposing polarity which are displaced a half wave cycle relative to each other for each oscillatory cycle, the duration of said voltage pulses being less than a fourth of the period of the oscillations of said transducer.

* * * * *